United States Patent [19]
Gurev

[11] 4,361,114
[45] Nov. 30, 1982

[54] METHOD AND APPARATUS FOR FORMING THIN FILM OXIDE LAYERS USING REACTIVE EVAPORATION TECHNIQUES

[75] Inventor: Harold Gurev, San Rafael, Calif.

[73] Assignee: Optical Coating Laboratory, Inc., Santa Rosa, Calif.

[21] Appl. No.: 260,047

[22] Filed: May 4, 1981

Related U.S. Application Data

[63] Continuation-in-part of Ser. No. 194,689, Oct. 6, 1980, abandoned.

[51] Int. Cl.$^3$ .......................... C23C 13/08; B05D 3/06
[52] U.S. Cl. ..................... 118/723; 118/726; 204/39; 204/164; 219/121 EB; 427/38; 427/39; 427/45.1; 427/124; 427/126.3; 427/163; 427/164
[58] Field of Search .................... 427/38, 45.1, 69, 93, 427/89, 94, 95, 99, 125, 126.3, 77, 124; 204/164, 39; 118/723, 726, 715; 13/2 P, 31 R, 31 EB; 219/121 P, 121 PA, 121 PB, 121 EB, 383, 384, 10.41; 428/1

[56] References Cited

U.S. PATENT DOCUMENTS

| | | | |
|---|---|---|---|
| 3,886,896 | 6/1975 | Van Cakenberghe | 118/723 |
| 4,015,558 | 4/1977 | Small et al. | 118/64 X |
| 4,112,137 | 9/1978 | Zega | 427/38 |
| 4,125,086 | 11/1978 | Vig et al. | 118/726 |
| 4,268,711 | 5/1981 | Gurev | 427/38 X |

FOREIGN PATENT DOCUMENTS

| | | | |
|---|---|---|---|
| 52/59888 | 5/1977 | Japan | 427/38 |
| 55/110127 | 8/1980 | Japan | 427/38 |

*Primary Examiner*—Thurman K. Page
*Attorney, Agent, or Firm*—Flehr, Hohbach, Test, Albritton & Herbert

[57] ABSTRACT

Apparatus and method for forming high quality thin film oxide layers on a substrate by a reactive evaporation process utilizing an oxygen plasma activation source in the form of a cylindrical boule of insulating material surrounded by a radio frequency coil for generating a radio frequency electromagnetic field in the boule of sufficient magnitude to create a self-igniting oxygen plasma within the boule without evaporating material from the walls thereof.

10 Claims, 3 Drawing Figures

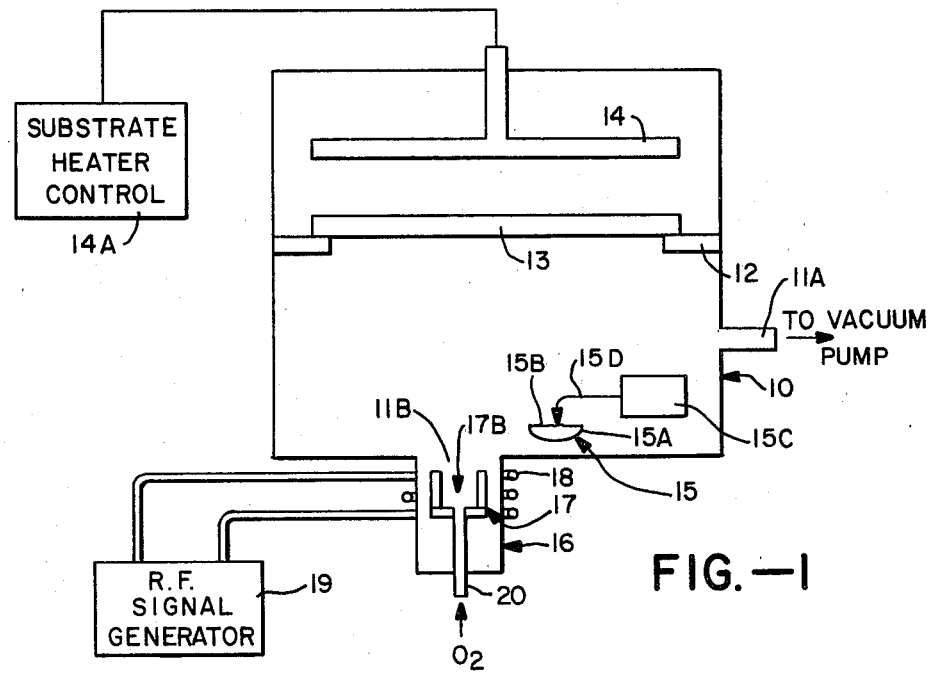
FIG.—1
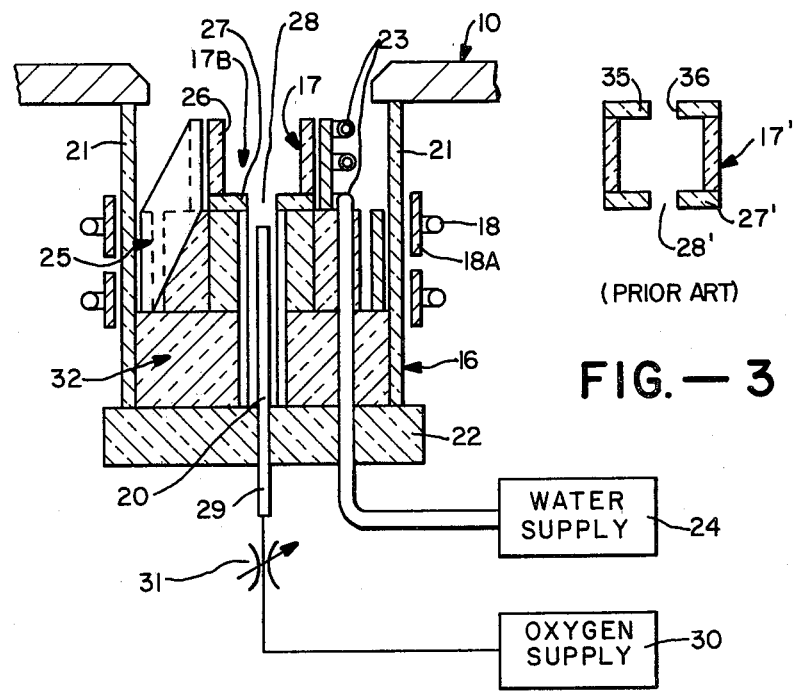
FIG.—2
FIG.—3

METHOD AND APPARATUS FOR FORMING THIN FILM OXIDE LAYERS USING REACTIVE EVAPORATION TECHNIQUES

This application is a continuation-in-part of application Ser. No. 194,689, filed Oct. 6, 1980 now abandoned.

This invention relates generally to methods and apparatus for forming thin film optical coatings on a substrate. More specifically, this invention relates to methods and apparatus for forming thin film oxide layers using an activated reactive evaporation process.

In general, prior art techniques for forming thin film oxide layers on a substrate have utilized sputtering, evaporation, chemical vapor deposition, or reactive evaporation. Most prior art approaches to sputtering and reactive evaporation involve very slow deposition rates. Prior art reactive evaporation approaches have generally required relatively high substrate temperatures in order to achieve proper stoichiometry and the requisite optical quality of the thin film oxide layer. Chemical vapor deposition (CVD) techniques permit formation of thin films at a more rapid deposition rate, but have the disadvantage of requiring equipment for handling the reactive gases supplied to the deposition chamber, some of which gasses are highly toxic and/or flammable. Also, high substrate temperatures are required for CVD. Slow deposition rates and high substrate temperatures are required in prior art reactive evaporation systems in order to promote sufficient oxidation of the evaporated material. Some of the types of metal oxide coatings which are of strong current interest in the optical coating art are transparent, conductive coatings of tin-doped indium oxide (also called indium-tin oxide or ITO). Transparent, electrically conducting thin films of ITO and indium oxide are useful in such applications as transparent electric heaters for aircraft windows and transparent electrode material or sophisticated optoelectronic devices such as liquid crystal and electrochromic display devices. These optoelectronic devices generally require the deposition of a metal oxide coating which has both relatively high transparency (e.g. overall transmittance at a wavelength of 500 nanometers substantially about eighty percent) and relatively high conductivity (e.g. sheet resistivity less than about 300 Ohms per square). Transparent, conductive coatings have also been shown to be useful as heat mirrors which reflect infrared radiation while transmitting visible light. Other types of transparent, conductive metal oxide films which have utility in these applications have been deposited from such materials as cadmium stannate or antimony-doped tin oxide. Transparent, conductive coatings are also useful as antistatic coatings on instrument panels although in this application the sheet resistivity may be relatively high (e.g. up to 10 megohm) and still provide the static elimination function. Accordingly, films containing tin oxide alone may be useful in such static control applications.

One standard method of producing metal oxide films to serve as transparent electrodes for optoelectronic display devices is to dispose a plurality of glass substrate sections in a rotating substrate holder in a batch coating machine. Individual substrate sections are rotated into the evaporation path of an evaporation source containing the metal film constituents. The source materials are evaporated at a slow rate onto the substrate in order to permit sufficient oxidation by oxygen molecules present in the vacuum evaporation chamber to form the metal oxide coating. Generally the deposition rate in this type of apparatus involves at least ten minutes per quarterwave optical thickness in the coating. In addition, the glass substrate is initially heated to above 200 degrees centigrade in order to promote the oxidation of the vaporized metal molecules arriving at the substrate surface. Because of the time required for loading and unloading the substrate holder in such a batch coater and the slow deposition rate for the metal oxide coating, the cost of producing the coating becomes a substantial part of the manufacturing cost of the optoelectronic display device.

A conveyor-based, high rate coating machine such as the one disclosed in Small et al. U.S. Pat. No. 4,015,558 issued Apr. 5, 1977 is a preferred coating arrangement for reducing the cost of forming selected types of optical coatings on rigid substrates of glass and other materials. However, use of equipment such as disclosed in the Small et al. patent is restricted to optical coatings which can be formed at substrate temperatures of about 100 degrees centigrade and further requires a thin film deposition rate of several minutes or less per quarterwave in order to be practical. Accordingly, deposition of high quality metal oxide coatings for optoelectronic devices and other product applications has not heretofore been possible in conveyor-based high rate coating apparatus such as disclosed in the Small et al. patent.

In a recent development in the art, higher deposition rates of metal oxide coatings have been achieved by utilizing an activated reactive evaporation technique. In this technique, to enhance the reactivity of the metal vapor species with the oxygen reaction gas, a dense plasma is generated by employing a thoriated tungsten emitter and a low voltage anode assembly, with magnetic field coils utilized to confine the plasma to a volume adjacent the substrate. In this prior art activated reactive evaporation technique, the substrate temperature is maintained at a relatively high value of around 350 degrees centigrade to achieve good optical quality (i.e. high transmission) in the deposited film.

This substrate temperature is incompatible with the deposited substrate temperatures achievable in the high rate coating apparatus disclosed in the Small et al. patent referenced above. In addition, the substrate temperature in this prior art activated reactive evaporation technique as well as the substrate temperature in the prior art batch coating technique are incompatible with depositing transparent, conductive metal oxide films on plastic substrates in either a rigid or flexible film form, since most plastics are incapable of withstanding temperatures above about 100 to 125 degrees centigrade even for short term, low-stress exposure.

Accordingly, it is an object of this invention to provide an improved method and apparatus for forming thin film oxide coatings in an activated reactive evaporation process.

More specifically, it is an object of this invention to provide a method and apparatus for forming high optical quality thin film oxide coatings in an activated reactive evaporation process utilizing low substrate temperatures.

It is a specific object of this invention to provide an improved method and apparatus for forming indium-tin oxide, indium oxide and tin oxide coatings using an activated reactive evaporation process at low substrate temperature.

It is a specific object of this invention to provide a method and apparatus for forming high quality transparent, conductive coatings of indium-tin oxide, indium oxide and tin oxide on a plastic substrate at low substrate temperature.

In accordance with one aspect of this invention the aforementioned objects are attained in a method of reactively depositing an oxide coating on a substrate in a vacuum deposition system which includes a vacuum chamber and an evaporation source disposed in the vacuum chamber. In the method a plasma source is disposed in a position to communicate with the interior of the chamber and comprises a boule of preselected insulating material defining a substantially closed cavity and a coil arrangement disposed generally around said boule and adapted to be connected to a supply of radio frequency energy to create a radio frequency electromagnetic field within the cavity. A continuous flow of oxygen is supplied to the cavity at a preselected flow rate. Radio frequency energy is supplied to the coil arrangement at a power level preselected to be below the power level required to evaporate materials from the wall of the boule but sufficient to create a self-igniting oxygen plasma within the cavity. The substrate is disposed in the vacuum chamber in the path of oxygen molecules emanating from the plasma source, and selected material contained within the evaporation source is evaporated onto the surface of the substrate.

Preferably, the preselected insulating material of the boule in the plasma source is fused silica. To deposit a conductive transparent coating of tin-doped indium oxide either a preselected mixture of indium and tin or tin-doped indium oxide itself is evaporated from the evaporation source. Similarly, to deposit coatings of pure tin oxide or indium oxide, the evaporation source may comprise the metal alone or the metal oxide. The method may be carried out with the substrate initially at room temperature or heated to an initial temperature which maintains the substrate well below 200 degrees centigrade throughout the evaporation step.

In accordance with another aspect of this invention, the above objects are achieved in apparatus for reactively depositing an oxide coating on a substrate which includes a vacuum chamber, means for evacuating the chamber and means for positioning a substrate of selected material in the chamber. In addition, an evaporation source is disposed in the chamber for depositing a preselected material onto the substrate. A plasma activation source is mounted to the chamber and comprises a boule of preselected insulating material defining a substantially closed cavity communicating with the interior of the vacuum chamber and a conductive coil arrangement disposed generally around boule with piping means for communicating a supply of oxygen to the cavity. Means are provided for supplying a radio frequency signal to the coil means to produce a radio frequency electromagnetic field within the cavity having a preselected magnitude of energy sufficient to create a self-igniting oxygen plasma within the cavity but insufficient to evaporate material from the walls of the boule.

For small area substrates the boule may have the configuration of a hollow, cylindrical element having substantially closed top and bottom walls with the bottom wall having an aperture therein to communicate oxygen to the interior of the boule and the top wall having an aperture therein for communicating activated oxygen molecules to the chamber. Where a relatively large area substrate is employed, the top end wall of the boule is preferably eliminated in order to enlarge the uniform flow area of the activated oxygen molecules exiting the interior of the boule.

The activated reactive evaporation method of this invention has the advantage of enabling a high optical quality thin film oxide layer to be formed utilizing substrate temperatures well under 200 degrees centigrade while maintaining relatively high deposition rates achieved by activated reactive evaporation techniques of the prior art which utilize higher substrate temperatures. This improvement was made possible by the surprising discovery that the use of an oxygen plasma activation source of the type generally disclosed in Van Cakenberghe U.S. Pat. Nos. 3,801,355 and 3,886,896, but operating at an electromagnetic RF energy value below that required to produce evaporation of material from the boule which forms the plasma cavity enables the effective deposition of a high optical quality oxide film at a much lower substrate temperature.

The improved apparatus and method of this invention enables the activated reactive evaporation method to be employed in a high rate coating apparatus such as disclosed in the above-referenced Small et al. patent since the substrate temperatures and the deposition rates involved in the present commercial embodiment of the Small et al. system are compatible with the substrate temperature and deposition rates utilized in accordance with this invention. Accordingly, high quality ITO or indium oxide films for optoelectronic display devices may be manufactured at substantially lower cost by incorporating the method and apparatus of this invention in the environment of the Small et al. deposition system.

Because of the common deposition parameters and principles involved, the method and apparatus of this invention may also be employed to form high optical quality thin films of other metal oxide materials at relatively high deposition rates and low substrate temperatures. Accordingly, this invention will permit high rate deposition of high quality oxide films on flexible plastic substrates, thereby enabling the production of quality multi-layer optical coatings on flexible media which can then be applied to other products to enhance the optical performance of such products.

Other objects, features, and advantages of this invention will be apparent from a consideration of the following detailed description taken in conjunction with the accompanying drawings.

FIG. 1 is a schematic view of a reactive deposition system which includes apparatus in accordance with this invention and which is useful in explaining the method of this invention.

FIG. 2 is a section view of a modified form of a plasma activation source useful in the apparatus of this invention.

FIG. 3 is a section view of a prior art configuration of a boule utilized in a plasma activated source which may also be utilized in some versions of the apparatus and method of this invention.

Referring now to FIG. 1, an example of one type of apparatus in accordance with this invention for reactively depositing an oxide coating on a substrate is shown. In addition, FIG. 1 illustrates apparatus which may be utilized in carrying out the method of reactively depositing an oxide coating in accordance with this invention. As illustrated in FIG. 1, a vacuum chamber 10 is provided with a first port 11A communicating with a vacuum pump (not shown) for evacuating the interior of chamber 10 to a low pressure, generally in the neighborhood of $10^{-3}$ to $10^{-4}$ Torr. A second port 11B is provided in the bottom of chamber 10 for communicating activated oxygen molecules from a plasma activation source 16 into the interior of vacuum chamber 10. Other ports, not shown, will be provided for introducing and removing substrate material from the vacuum chamber 10.

Provided within vacuum chamber 10 is a substrate holder 12 which holds a substrate 13 in position with respect to an evaporation source arrangement 15 and plasma activation source 16. A substrate heater 14 is provided in the interior of chamber 10 to produce, when desired, an initial heating of substrate 13 to an initial temperature prior to deposition of material from evaporation source 15. A substrate heater control 14A coupled to substrate heater 14 may be utilized to control the degree of heating of substrate 13. For some applications no preheating of the substrate is required to produce a satisfactory oxide film using the approach of this invention.

Evaporation source arrangement 15 may comprise any conventional evaporation source such as the electron gun arrangement depicted. In the electron gun arrangement depicted, a source boat or crucible 15A is provided for holding the material to be evaporated. An electron gun 15C produces a beam of electrons 15D which is directed into container 15A to heat the source material 15B thereby causing it to evaporate. Other conventional evaporation source arrangements such as resistance heated sources may be utilized in place of the electron gun arrangement depicted.

In accordance with this invention, an oxygen plasma activation source 16 having generally the configuration disclosed in the above-referenced Van Cakenberghe patents is disposed on the underside of deposition chamber 10 to produce an activated oxygen plasma which is communicated to the interior of deposition chamber 10 and specifically to the surface of substrate 13. Generally, plasma activation source 16 includes a boule 17 which forms a cavity 17B to which a supply of oxygen gas is provided by a piping arrangement 20. A coil arrangement 18 is provided surrounding boule 17 with coil arrangement 18 connected to an RF signal generator 19 to supply radio frequency electromagnetic radiation to the cavity 17B in boule 17. In the aforementioned Van Cakenberghe patents sufficient radio frequency electromagnetic energy is supplied to the cavity of the boule to produce a degree of heating of the interior walls of boule 17 to evaporate the material of which those walls is formed. That evaporated material is communicated to the interior of a vacuum chamber for deposition onto a substrate positioned therein. In accordance with this invention, the magnitude of radio frequency electromagnetic energy supplied to the cavity 17B is maintained at a level sufficient to create a self-igniting oxygen plasma within cavity 17B but below the power level required to evaporate materials from the walls of boule 17. Boule 17 is preferably formed of a fused silica material although other insulating materials such as boron nitride or aluminum oxide could also be utilized. While boule 17 is shown in FIG. 1 with its walls ending below the bottom of deposition, it is possible, and in some cases, advantageous to extend the walls of the boule into the deposition chamber. Moreover, the complete plasma activation source 16 could be mounted within the chamber.

It has been surprisingly discovered that by providing a plasma activation source of the Van Cakenberghe type in combination with a conventional evaporation source arrangement 15, and operating the Van Cakenberghe type source solely as an oxygen plasma activator rather than an evaporation source itself, a high quality oxide film can be formed on substrate 13 at fairly high deposition rates without requiring a substantial heating of substrate 13 by substrate heater 14 to promote the oxidation of the evaporated material. Apparently, although for reasons not clearly understood, the Van Cakenberghe arrangement operated as a plasma activation source provides a beam of oxygen molecules which have been effectively activated to combine with the vapor molecules emanating from the evaporation source 15 to form an oxide film on substrate 13 at a lower substrate temperature than can be achieved with other types of plasma sources. As will be discussed below in more detail, the capability provided by this invention to form high quality oxide films on a substrate at low initial substrate temperatures and at substantial deposition rates, enables among other things the use of high rate conveyor-type coating apparatus to deposit transparent electrically conductive films (e.g. tin-doped indium oxide) on glass substrates to serve as transparent electrodes for sophisticated optoelectronic devices.

FIG. 2 depicts in more detail the construction of a modified version of a Van Cakenberghe plasma source arrangement 16 as utilized in one embodiment of this invention. Generally the physical and operational characteristics of plasma activated source 16 are very similar to those disclosed in Van Cakenberghe U.S. Pat. No. 3,886,896. As shown in FIG. 2, the general structural elements of plasma activation source 16 consist of a cylindrical housing 21 formed of an insulating material and mounted to the underside of a bottom wall of vacuum chamber 10 at a location where a port 11B is formed therein. An end wall 22 mounted on the bottom of housing 21 provides support for a support structure arrangement 32 which supports boule 17 in the position shown and also supports a flux concentrator arrangement 25. Flux concentrator arrangement 25 generally has the configuration depicted in FIG. 2 of the Van Cakenberghe '896 patent, the disclosure of which is hereby incorporated by reference. Support structure arrangement 32 has a central channel formed therein for receiving an oxygen supply tube 29 which communicates with oxygen supply 30 through a variable restrictor valve arrangement 31 which may be utilized to control the rate of oxygen flow into cavity 17B within boule 17. As shown, coil 18A which is coupled to the RF signal generator (not shown in FIG. 2) consists of a coiled conductor 18 mounted on a coiled bar 18A surrounding container 21. A cooling coil arrangement 23 is provided around the flux concentrator arrangement 25 and communicates with a supply of water or other coolant 24 to cool flux concentrator 25, thereby generally restricting heat generation from the RF electromagnetic energy to the cavity 17B within boule 17.

The boule 17 in FIG. 2 consists of a hollow, cylindrical section 26 together with a bottom end wall 27 which has an aperture 28 therein through which oxygen is communicated to the cavity 17B. In the embodiment depicted in FIG. 2, no top end cap (as is typically provided on a boule in a Van Cakenberghe type source) is present. The boule configuration in FIG. 2 has been found to be advantageous when the plasma activation source 16 is utilized for depositing material onto a large substrate area. Removal of the top cover usually utilized on a Van Cakenberghe source appears to provide a wider area of uniform distribution of activated oxygen molecules from the source, thus producing more uniform thin film characteristics over the surface of a broad substrate area.

FIG. 3 shows the configuration of a typical boule in a Van Cakenberghe source. The conventional boule 17' includes not only the hollow, cylindrical section 26' but both bottom end wall 27' and top end wall 35. Top end wall 35 is then provided with an aperture 36 through which activated oxygen molecules are communicated into the interior of deposition chamber 10. The boule configuration of FIG. 3 is useful in conjunction with small area substrates.

The method and apparatus of this invention have been applied to the activated reactive evaporation of indium and tin to form an ITO coating on various selected substrates. The method and apparatus of this invention have also been applied to the activated reactive evaporation of both indium and tin alone to form transparent, conductive indium oxide and tin oxide coating. Tables I and II below illustrate the results achieved by the method and apparatus of this invention in depositing ITO films on glass substrates. In the data given in Table I, the substrate was positioned about ten inches from the top of the plasma activation source and the evaporation of indium and tin was carried out using a conventional resistance heated evaporation unit. The actual data given in Table I is for ITO films on glass substrates which were baked at a 550 degree centigrade temperature for one hour to provide a check on the stability of the deposited films. As can be seen from the data in Table I, the deposited ITO films are stable since the data shows that the optical transmission and the sheet resistivity $R_s$ of the films are not substantially degraded after baking. In addition, the data in Table I shows that the ITO films of high quality may be achieved with coating temperatures well below 200 degrees centigrade. The coating rates of about 50 to 100 Angstroms per second are roughly one hundred times faster than the maximum coating rate which can be achieved with a reactive evaporation method which does not utilize a plasma activated source. In addition to the deposition of ITO coatings on glass substrates, similar runs of ITO coatings on flexible plastic substrates were performed. In particular a polyester film was coated with an ITO coating without any thermal damage to the film substrate.

TABLE I

| | As Coated | | 550° C./1 Hr. | |
|---|---|---|---|---|
| Sample | OAT Peak* (%) | $R_s$ ($\Omega/\square$) | OAT Peak (%) | $R_s$ ($\Omega/\square$) |
| 35-5 | 92.5 | 850 | 91.5 | 500 |
| 32-6 | 91.5 | 190 | — | — |
| 32-9 | 90.5 | 80 | 86.0 | 60 |
| 37-5 | 92.0 | 250 | — | — |
| 37-6 | 73.0 | 100 | 89.5 | 150 |

| | | | Coating Temp. | |
|---|---|---|---|---|
| Sample | Thickness (Angstroms) | Deposition (Å/sec) | Start of Run (°C.) | End of Run (°C.) |
| 35-5 | 1650 | 53 | 79 | 106 |
| 32-6 | 1875 | 150 | 80 | 100 |
| 36-9 | 1250 | 62.5 | 102 | 142 |
| 37-5 | 1400 | 70 | 102 | 139 |
| 37-6 | 2950 | 98 | 139 | 168 |

*OAT means "overall transmittance"

The data in Table II relates to ITO coatings on glass substrates in which the separation distance between the substrate and both the plasma activation source and the evaporation source was about forty inches. The initial substrate temperature was raised to about 95 degrees centigrade and the final substrate temperature shows a slight increase due to the radiation from the resistance source. An electron beam evaporation source would produce a substantially lesser rise in substrate temperature. The data as set forth in Table II is for ITO films which are approximately 300–400 Angstroms in thickness which corresponds generally to the coating thickness typically used in optoelectronic display devices such as liquid crystal display devices.

TABLE II

| Run # | $t_{initial}$ (°C.) | $T_{final}$ (°C.) | $R_s$ ($\Omega/\square$) | OAT$_{550nm}$ (%) | Absorptance$_{550nm}$ (%) |
|---|---|---|---|---|---|
| 369 | 95 | 133 | 326 | 83 | — |
| 370 | 95 | 132 | 196 | 85.5 | 1 |
| 372 | 95 | 138 | 245 | 85 | 1.5 |
| 373 | 95 | 130 | 211 | 86 | 1 |
| 374 | 95 | 126 | 263 | 86.5 | 1 |
| 375 | 95 | 132 | 383 | 87.5 | .5 |
| 377 | 95 | 129 | 230 | 86 | 0 |
| 379 | 95 | 130 | 262 | 86.5 | .5 |
| 380 | 95 | 120 | 286 | 84 | 1.5 |
| 381 | 95 | 127 | 190 | 85 | 1.5 |

The data in Table III below shows measurements performed on ITO films deposited simultaneously on glass substrates and flexible films of polyethylene terepthalate (PET: ICI type 442 film, 92 gage). The data in Table III shows that generally comparable results are achieved when the ITO coating is formed on the glass and the flexible plastic substrates.

TABLE III

| | | | | $R_s$ | | OAT$_{550nm}$ | |
|---|---|---|---|---|---|---|---|
| RUN | $T_{initial}$ (°C.) | $T_{final}$ (°C.) | Physical Thickness (Angstroms) | on PET ($\Omega/\square$) | on glass ($\Omega/\square$) | on PET (%) | on glass (%) |
| 423 | 100 | 121 | 250–330 | 285 | 326 | 83.5 | 83 |
| 419 | 70 | 102 | 300–350 | 292 | 280 | 82 | 83 |
| 420 | 70 | 95 | 300–350 | 262 | — | 82 | — |
| 428 | 120 | 135 | 300–350 | 436 | 200 | 84 | 87 |
| 416 | 70 | 121 | 1500 | 65 | 69 | 79 | 78 |

The data shown in Tables II and III illustrate that the method and apparatus of this invention can be employed in conjunction with the coating system disclosed in the above-referenced Small et al. patent to achieve a high rate automated coating of ITO on glass substrates for use in various optoelectronic display devices. Conversion from a batch coating process of the prior art to a continuous conveyor-based coating process as disclosed in the Small et al. patent, will substantially reduce the cost of producing glass substrates with transparent electrode films thereon. The transparent conductive electrode films produced in accordance with this invention will have generally comparable optical and electrical qualities to those produced in the prior art batch coating arrangement described above.

In addition to the evaporated ITO coatings described above, the method and apparatus of this invention was applied to the activated reactive evaporation of indium alone to form an indium oxide coating on a glass substrate. In one production run an indium oxide coating about 400 Angstroms thick was deposited with an initial substrate temperature of 108 degrees centigrade and a final substrate temperature of about 120 degrees centigrade. The overall transmission measured at 515 nanometers was eighty-five percent and the sheet resistivity was measured at 250 Ohms per square. In a second production run using indium alone, an optical coating about 350 Angstroms thick was formed in a reactive evaporation process starting with a substrate temperature of about 107 degrees centigrade and a final substrate temperature of about 115 degrees centigrade. The overall optical transmission at 550 nanometers for this film was about eighty-seven percent and the sheet resistivity was about 200 Ohms per square.

The method and apparatus of this invention was also applied to the activated reactive evaporation of tin alone to form a tin oxide coating on a glass substrate. A tin oxide coating having a thickness of about 300 Angstroms was formed starting with a substrate temperature of about 140 degrees centigrade and rising to about 155 degrees centigrade at the end of the evaporation. The overall transmission of the tin oxide film at 550 nanometers was measured to be about eighty-four percent and the sheet resistivity was about 10 megohm per square. While this sheet resistivity for the tin oxide film is too high to be utilized in optoelectronic display devices, it could be utilized in static charge control applications which do not require low resistivity. Since the cost of tin is about one percent the cost of indium, tin oxide coatings may be particularly attractive for static charge control applications utilizing roll coating techniques on flexible polymer substrates such as PET. Furthermore, if a somewhat lower sheet resistivity is needed, the tin oxide coating may be formed to a greater thickness. While this will reduce the overall transmission of the coating, the sheet resistivity will be substantially reduced.

While the method and apparatus of this invention have been illustrated in conjunction with the formation of ITO, indium oxide, and tin oxide coatings on various substrates, the method and apparatus of this invention are also applicable to the formation of other conductive, transparent metal oxides or of other high quality oxide coatings such as thin films of silicon dioxide, titanium dioxide and vanadium oxide. Accordingly, while the method and apparatus of this invention have been illustrated with exemplary embodiments, it should be apparent that numerous alternatives and changes could be made without departing from the scope of this invention as claimed in the following claims.

What is claimed is:

1. In a method of reactively depositing an oxide coating on a substrate in a vacuum deposition system which includes a vacuum chamber and an evaporation source disposed in said chamber, the steps of:
   disposing a plasma source in a position to communicate with the interior of said chamber and comprising a boule of preselected insulating material defining a substantially closed cavity and a coil arrangement disposed generally around said boule and adapted to be connected to a supply of radio frequency energy to create a radio frequency electromagnetic field within said cavity;
   supplying to said cavity a continuous flow of oxygen at a preselected flow rate;
   supplying radio frequency energy to said coil arrangement at a power level preselected to be below the power level required to evaporate material from the walls of said boule but sufficient to create a self-igniting oxygen plasma within said cavity;
   disposing said substrate in said vacuum chamber in the path of activated oxygen molecules emanating from said plasma source; and
   evaporating a selected material onto a surface of said substrate from said evaporation source.

2. The method of claim 1, wherein said preselected insulating material of said boule is fused silica and said selected material evaporated onto said substrate is one of indium, tin, or a preselected mixture of indium and tin, whereby a conductive, transparent coating is formed on said substrate.

3. The method of claim 1, wherein said preselected insulating material of said boule is fused silica and said selected material evaporated onto said substrate is one of indium oxide, tin oxide, or a mixture of tin oxide and indium oxide.

4. The method of any of claims 2 or 3, wherein said substrate is glass, said substrate is heated to an initial temperature of around 100 degrees centigrade prior to said evaporation step, and said evaporation step is carried out for a period of time sufficient to deposit a tin-doped indium oxide film to a thickness of about 300 Angstroms.

5. The method of claim 1, wherein said substrate is plastic, and during said evaporation step said substrate is maintained at a temperature under about 125 degrees centigrade.

6. In apparatus for reactively depositing an oxide coating on a substrate, in combination:
   a vacuum chamber; means for evacuating said chamber; means for positioning a substrate of selected material in said chamber; an evaporation source disposed in said chamber for depositing a preselected material onto said substrate; a plasma activation source mounted to said chamber and comprising a boule of preselected insulating material defining a substantially closed cavity communicating with the interior of said vacuum chamber, a conductive coil arrangement disposed generally around said boule, and piping means for communicating a supply of oxygen to said cavity; and means for supplying a radio frequency signal to said coil means to produce a radio frequency electromagnetic field within said cavity having a preselected magnitude of energy sufficient to create a self-igniting oxygen plasma within said cavity but insufficient to evaporate material from the walls of said boule.

7. Apparatus as claimed in claim 6, wherein said preselected insulating material of said boule is fused silica, and said preselected material in said evaporation source is one of indium, tin, or a preselected mixture of indium and tin.

8. Apparatus as claimed in claim 6, wherein said preselected insulating material of said boule is fused silica, and said preselected material in said evaporation source is one of indium oxide, tin oxide, or a mixture of tin oxide and indium oxide.

9. Apparatus as claimed in any of claims 7 or 8, wherein said substrate is glass, and said apparatus further includes a substrate heater positioned within said chamber and adapted to heat said substrate, and means for controlling the temperature of said substrate heater to heat said glass substrate to an initial temperature of around 100 degrees centigrade prior to operation of said evaporation source.

10. Apparatus as claimed in claim 6, wherein said boule comprises a hollow, generally cylindrical element with a bottom and substantially closed and having an aperture therethrough for supplying oxygen to the interior of said cylindrical element and a top and substantially open to communicate activated oxygen molecules to said chamber over a relatively large flow area of substantially uniform density.

* * * * *